(12) United States Patent
Buschle et al.

(10) Patent No.: US 10,678,291 B2
(45) Date of Patent: Jun. 9, 2020

(54) ACTUATOR, IN PARTICULAR, FOR A MOTOR VEHICLE

(71) Applicant: MARQUARDT GMBH, Rietheim-Weilheim (DE)

(72) Inventors: Roland Buschle, Muehlheim (DE); Rainer Berchtold, Tuttlingen-Nendingen (DE); Robert Masa, Rottweil (DE)

(73) Assignee: Marquardt GmbH, Reitheim-Weilheim (DE)

( * ) Notice: Subject to any disclaimer, the term of this patent is extended or adjusted under 35 U.S.C. 154(b) by 1041 days.

(21) Appl. No.: 15/161,561

(22) Filed: May 23, 2016

(65) Prior Publication Data

US 2016/0306380 A1 Oct. 20, 2016

Related U.S. Application Data

(63) Continuation of application No. PCT/EP2014/075818, filed on Nov. 27, 2014.

(30) Foreign Application Priority Data

| Nov. 29, 2013 | (DE) | 10 2013 017 966 |
| Nov. 29, 2013 | (DE) | 10 2013 017 968 |
| Nov. 29, 2013 | (DE) | 10 2013 017 969 |

(51) Int. Cl.
*G05G 9/047* (2006.01)
*G05G 5/00* (2006.01)
(Continued)

(52) U.S. Cl.
CPC ............ *G05G 9/047* (2013.01); *G05G 5/005* (2013.01); *F16H 59/105* (2013.01);
(Continued)

(58) Field of Classification Search
CPC .......... F16H 59/105; F16H 2059/0273; G05G 5/005; G05G 9/047; G05G 2009/0474; G05G 2009/04751
(Continued)

(56) References Cited

U.S. PATENT DOCUMENTS 4,519,266 A * 5/1985 Reinecke ............... F16H 59/044
116/DIG. 20
4,610,179 A * 9/1986 Parker .................... F16H 59/08
200/61.88
(Continued)

FOREIGN PATENT DOCUMENTS

DE 32 13 151 A1 10/1983
DE 3319417 A1 12/1984
(Continued)

OTHER PUBLICATIONS

International Search Report and Written Opinion, International Application No. PCT/EP2014/075818, dated Jul. 14, 2016 (19 pages).
(Continued)

*Primary Examiner* — William C Joyce
(74) *Attorney, Agent, or Firm* — Burr & Brown, PLLC

(57) ABSTRACT

A control element, in particular, a switching device for the manual actuation of functions in a motor vehicle, having a handle. The handle is mounted on a carrier such that the handle is adjustable in two different directions from a neutral position into adjustment positions. The control element furthermore can detect the adjustment positions, with the control element having a code carrier for the detection of the adjustment positions, which encodes the adjustment positions, and a sensor which senses the coding, in such a way that all adjustment positions can be detected by way of the one code carrier.

24 Claims, 6 Drawing Sheets

(51) Int. Cl.
*F16H 59/02* (2006.01)
*F16H 59/10* (2006.01)

(52) U.S. Cl.
CPC ............... *F16H 2059/0273* (2013.01); *G05G 2009/0474* (2013.01); *G05G 2009/04751* (2013.01); *H03K 2217/96062* (2013.01)

(58) Field of Classification Search
USPC .............................. 74/473.12, 473.3, 473.33
See application file for complete search history.

(56) References Cited

U.S. PATENT DOCUMENTS

| | | | |
|---|---|---|---|
| 5,956,016 | A | 9/1999 | Kuenzner et al. |
| 6,415,677 | B1 * | 7/2002 | Skogward ........... F16H 59/0217 324/117 H |
| 7,293,480 | B2 * | 11/2007 | Matsui ................. F16H 59/105 74/471 XY |
| 8,333,128 | B2 * | 12/2012 | Schober ............... F16H 59/105 74/473.12 |
| 2005/0028634 | A1 | 2/2005 | Giefer et al. |
| 2008/0006113 | A1 | 1/2008 | Matsui et al. |
| 2008/0041182 | A1 | 2/2008 | Giefer et al. |
| 2008/0197004 | A1 | 8/2008 | Ishigaki et al. |
| 2010/0147099 | A1 | 6/2010 | Maurer et al. |
| 2011/0183759 | A1 | 7/2011 | Lin |
| 2014/0216194 | A1 | 8/2014 | Lindner et al. |

FOREIGN PATENT DOCUMENTS

| | | |
|---|---|---|
| DE | 196 46 226 A1 | 5/1998 |
| DE | 102 31 015 A1 | 3/2004 |
| DE | 10 2006 016 4 | 10/2007 |
| DE | 10 2008 063 238 A1 | 6/2010 |
| DE | 10 2011 101 123 A1 | 11/2012 |
| DE | 10 2011 087 162 A1 | 6/2013 |
| FR | 2 737 160 A1 | 1/1997 |
| JP | 2007-030762 A | 2/2007 |
| JP | 2008-062664 A | 3/2008 |
| JP | 2008-155727 A | 7/2008 |
| WO | 91/15864 A1 | 10/1991 |

OTHER PUBLICATIONS

International Preliminary Report on Patentability, International Application No. PCT/EP2014/075818, dated Jul. 21, 2016 (12 pages).
English translation of the International Preliminary Report on Patentability, International Application No. PCT/EP2014/075818, dated Jul. 21, 2016 (15 pages).
German Search Report (Application No. 10 2013 017 966.1) dated Oct. 1, 2014.
German Search Report (Application No. 10 2013 017 968.8) dated Oct. 1, 2014.
German Search Report (Application No. 10 2013 017 969.6) dated Oct. 1, 2014.
Chinese Office Action (Application No. 201480074570.3) dated Apr. 28, 2017 (with English translation).

* cited by examiner

ACTUATOR, IN PARTICULAR, FOR A MOTOR VEHICLE

CROSS REFERENCE TO RELATED APPLICATIONS

This application is a continuation of International Application No. PCT/EP2014/075818 filed Nov. 27, 2014, which designated the United States, and claims the benefit under 35 USC § 119(a)-(d) of German Application Nos. 10 2013 017 969.6, 10 2013 017 968.8 and 10 2013 017 966.1, each filed Nov. 29, 2013, the entireties of which are incorporated herein by reference.

FIELD OF THE INVENTION

The present invention relates to a control element.

BACKGROUND OF THE INVENTION

Control elements, such as electrical and/or electronics switching devices in the form of a joystick and/or cursor switch, serve for the manual actuation of functions in a motor vehicle. Inter alia, such switching devices are used for the inputting of data for an electrical unit by a user, for example, in the case of automobile radios, navigation units, on-board computers or similar units in the motor vehicle. In particular, a control element of this type may also be used as an electronic gear selector switch for a motor vehicle transmission controlled in shift-by-wire fashion.

A control element of this type has a handle which may, for example, be formed in the manner of a selector lever. The handle is mounted in movable fashion on a carrier, in such a way that the handle is adjustable manually in two different directions from a neutral position into adjustment positions. Specifically, the handle is adjustable into at least in each case one adjustment position associated with the respective direction. The control element furthermore has a means for the detection of the adjustment positions. The means for the detection of the adjustment positions is of cumbersome design in the case of the known control element.

SUMMARY OF THE INVENTION

The present invention is based on the object of further developing the control element such that the means for the detection of the adjustment positions is of simpler design. In particular, it is the intention for the means for the detection of the adjustment positions to be further improved with regard to the costs and robustness thereof.

In the case of the control element according to the present invention, the means for the detection of the adjustment positions comprises a code carrier which has a coding for the adjustment positions, and comprises a sensor which senses the coding. Here, the coding is in particular a unique coding for the adjustment positions. In this way, all adjustment positions can be detected by way of the one single code carrier. The control element according to the present invention is distinguished by a high level of functional reliability.

To further increase the ergonomics for the operation of the control element by the user, the adjustment movement may be a pivoting movement of the handle, whereby the handle is preferably a pivotable selector lever. The handle may be adjustable about a first and a second pivot axis in a first and a second pivoting direction, wherein the two pivoting directions may be approximately perpendicular to one another. In a compact refinement, the carrier for the handle may be formed in the manner of a Cardan joint and/or a universal joint.

It may expediently be provided that, during adjustment of the handle, the code carrier and the sensor are movable relative to one another. In a simple refinement, the code carrier and/or the sensor may be articulated on the handle such that the code carrier and/or the sensor are/is movable by way of the handle correspondingly to the adjustment of the handle.

In a compact refinement, the code carrier may interact with the handle such that the code carrier is, owing to the pivoting movement of the handle, linearly movable in two directions. The two directions of the linear movement may, in particular, be mutually perpendicular. Such an interaction of the handle with the code carrier can be effected in a simple manner by way of a pin that engages into an elongated hole.

In an expedient refinement, a pin may be arranged on the handle, specifically, in particular, on a lever arm of the handle. The pin engages into an elongated hole, which runs in one direction of the linear movement, of the code carrier. At least one further pin may be arranged on the carrier, specifically in particular on an elongation on the carrier. The pin engages into an elongated hole, which runs in the further direction of the linear movement, of the code carrier. By way of such an arrangement, it is consequently the case that the pivoting movement of the handle is converted into a corresponding linear movement of the code carrier, such that simple and functionally reliable detection of the adjustment positions by way of the sensor is realized.

In an inexpensive manner, the code carrier may comprise a magnetic code plate, and the sensor may be composed of a magnetic sensor. In particular, the magnetic sensor may be a Hall sensor, a magnetoresistive sensor, an inductive sensor or the like. The coding for the adjustment positions may in turn be composed of a magnetization, uniquely associated with the respective adjustment position, of the code plate.

In order to realize a compact refinement, the code carrier may comprise a printed circuit board. The printed circuit board may expediently accommodate the electronics for the control element, which electronics serve for example for the evaluation of the signals of the sensor. For the sake of simple installation, the magnetic code plate may be arranged on the printed circuit board.

In a simple manner, the magnetic code plate may be fastened to the printed circuit board by way of spacer pieces in the form of separators. The spacer pieces may be in the form of metal spacers, formed for example by way of a corresponding coating. In this way, the code plate can then be fastened magnetically, that is to say by way of magnetic force, to the printed circuit board. The metal spacers may be applied to the printed circuit board, in a simple manner in terms of manufacturing, by way of soldering in an SMD (Surface Mounted Device) process.

For a particularly preferred refinement of the invention, the following must be stated.

In the case of a shift-by-wire gearshift box, it is the intention for the signal detection system to be improved with regard to costs and robustness.

For this purpose, the signal detection is no longer divided up into different movement directions and detected by way of individual metal plates, as before, but is combined in one coding system, and evaluated. The mounting of the magnetic code plate is realized by way of coated metal spacers applied to the printed circuit board in the SMD process.

In this way, a magnetic plate system for the detection of signals in two spatial directions, including the mounting of the magnetic plate system, that is to say including the magnetic mounting arrangement, is realized.

The advantages achieved by way of the invention consist, in particular, in that the overall costs for the control element are considerably reduced as a result of the reductions in terms of parts for the signal detection. Furthermore, the accuracy of the system is improved by way of the magnetic mounting of the plates. Previously required manufacturing steps, such as greasing of the guides in order to prevent noise generation during the adjustment of the handle, can be omitted.

In the case of a control element, in a further refinement, the handle is mounted movably on a carrier such that the handle is adjustable manually in at least one direction from a neutral position into an adjustment position. The adjustment movement is in the form of a detent movement and/or the adjustment position is in the form of a detent position, in such a way that a detent force acts on the handle during the adjustment movement and/or in the adjustment position. In the case of a control element of the type, the force profile acting on the user for the adjustment movement and/or for the adjustment into the detent position may be non-uniform.

It is, therefore, the intention for the control element to be further developed such that the force profile for the adjustment movement of the handle is substantially uniform. In particular, it is sought to improve the operating haptic action of the handle for the user.

In the case of the further developed control element, the detent force can be generated by way of a spring-loaded thrust piece. Owing to the spring force that acts on the handle via the thrust piece during the adjustment movement, the force profile for the adjustment movement is advantageously substantially uniform.

For an expansion of the functionality, the handle may be designed to be adjustable from a neutral position in two different directions into at least in each case one adjustment position associated with the respective direction. Furthermore, a means for the detection of the adjustment positions may be provided.

For the purposes of further improving the ergonomics for the operation of the control element by the user, the adjustment movement may be a pivoting movement of the handle, whereby the handle is preferably a pivotable selector lever. The handle may be adjustable about a first and a second pivot axis in a first and a second pivoting direction, wherein the two pivoting directions may be approximately perpendicular to one another. In a compact refinement, the carrier for the handle may be formed in the manner of a Cardan joint and/or a universal joint.

In a simple and compact refinement, the spring-loaded thrust piece may be capable of being placed in interaction with a slotted guide. In particular, the interaction may serve for generating a haptic action for the adjustment of the handle. In a simple manner, the spring-loaded thrust piece may be pushed into the slotted guide for interaction purposes by way of a movable adapter.

To further increase the functionality of the control element, provision may be made whereby the handle can be blocked with regard to the adjustment and can be released for the adjustment by the user. In a simple manner, the blocking and/or the release of the handle can be realized by way of a geometry integrally formed on the adapter. In a compact refinement, it is possible for this purpose for an actuable blocking means to be capable of being operatively connected to and/or operatively disconnected from the geometry.

Furthermore, provision may be made whereby the adapter can be moved, for the purposes of acting on the thrust piece, by way of an actuator, whereby, for example, the haptic action for the control element can be set and/or the adjustment movement for the handle can be set to a movement gate. The actuator may be an electric motor, an electromagnet or the like.

For a particularly preferred refinement of the invention, the following must be stated.

In the case of a shift-by-wire gearshift box, it is the intention for the previous confinement system of the manual gearshift gate for the selector lever to be improved with regard to the operating haptic action. In particular, it is the intention to realize a uniform force profile for the respective pivoting movement of the selector lever. Furthermore, it is the intention for the blocking function of the manual gate, previously realized by way of a separate blocking magnet, to be integrated into the same actuator.

The detent action in the manual gearshift gate is generated by a spring-loaded thrust piece rather than, as previously, by way of the magnetic cohesion of armature plate and confinement system. The spring-loaded thrust piece is pushed into the slotted guide by way of an adapter part in order to generate the haptic action. At the same time, the unlocking of the gate block is realized by way of a geometry integrally formed on the adapter. The linear movement of the adapter is realized by way of an actuator, for example, an electromagnet or an electric motor. When the actuator is not energized, the spring-loaded thrust piece is lifted out of the slotted guide. The universal joint thereby pivots into the neutral position, that is to say into a vertical position, and the block locks the entire system.

A mechatronic actuator system for the detent locking and/or return movement and/or blocking of an actuation element in shift-by-wire systems is thus realized.

The advantages achieved by way of the present invention consist, in particular, in that the detent function is realized with considerably improved haptic action in relation to the previous detent locking realized by way of a confinement system. The construction of the unit is made less expensive, because the system parameters can be expanded and no longer have to exhibit narrow tolerances, as before. The overall unit is furthermore made considerably cheaper in this way, because only one actuator is required.

In the case of a control element in a further refinement, the handle is mounted movably on a carrier such that the handle is adjustable manually by a user. Here, the handle may be designed such that it can be blocked with regard to operation and released for operation by the user. The release of the handle was previously realized by way of actuation of a button by the user, the so-called "unlock" button, wherein difficulties for the user in understanding the handling sequence in operating the unlock button are observed.

It is, therefore, the intention for the control element to be further developed such that the operation of the handle is improved, in particular, with regard to the release thereof.

In the case of the further developed control element, a sensor for interaction with the handle is provided, in such a way that, as a result of the handle being approached and/or touched, in particular gripped, by the user, in particular, by a hand of the user, the operating demand of the user can be identified and the handle can be released for operation, and/or some other functionality in the motor vehicle can be triggered. A control element of the type advantageously identifies the operating demand of the user without the need for additional actuation actions by the user, whereby the control element can be operated by the user intuitively.

To expand the functionality, the handle may be designed to be adjustable from a neutral position in two different directions into at least in each case one adjustment position associated with the respective direction. Furthermore, a means for the detection of the adjustment positions may be provided.

For the purpose of further improving the ergonomics for the operation of the control element by the user, the adjustment movement may be a pivoting movement of the handle, whereby the handle is preferably a pivotable selector lever. The handle may be adjustable about a first and a second pivot axis in a first and a second pivoting direction, wherein the two pivoting directions may be approximately perpendicular to one another. In a compact refinement, the carrier for the handle may be formed in the manner of a Cardan joint and/or a universal joint.

In a simple and inexpensive refinement, the sensor may be a capacitive sensor. A sensor of the type detects the change in the electric field in the surroundings of the handle owing to the action of the user, for example, by way of his or her hand, in order, in turn, to derive from this the operating demand of the user. Other sensors may self-evidently also be used for this purpose. Accordingly, the sensor may also be an optical sensor which operates by way of optical radiation, or an inductive sensor. As optical radiation, infrared (IR) radiation appears particularly advantageous, because this is not visible to the eye of the user.

In a further expedient refinement, a blocking means for the handle may be provided. By way of the blocking means, it is thus possible for the manual adjustment of the handle to be blocked and released. The sensor may generate a sensor signal in the event of the operating demand of the user being identified. The sensor signal may then serve for the actuation of the blocking means for the release of the handle.

For a particularly preferred refinement of the present invention, the following must be stated.

With regard to the operation of the unlock button in shift-by-wire systems in the vehicle, which unlock button was previously arranged as an electrical switch with button function on the handle, difficulties in understanding the handling sequence repeatedly arise. Labelling of the button also shows no considerable improvement with regard to the understanding of operation.

To improve this problem, it is proposed that the unlock button function be monitored by way of a capacitive sensor and that the gripping of the gear selector switch be interpreted as the driver demand. The operational reliability is uniquely defined by way of the identification panel under the previous button. Pushing of the button is omitted; the driver demand "0" or "R" for the automatic transmission is directly implemented in the case of actuation of the selector lever and in the presence of the corresponding vehicle states.

The present invention thus provides an in particular capacitive signal detection for shift-by-wire systems.

The advantages achieved by way of the present invention consist in particular in that, by way of the invention, the operation of the overall system is considerably simpler and more convenient for the user. Furthermore, the solution exhibits a considerable cost saving potential in relation to the previous button solution, because, in this respect, an electrical switch on the handle can be dispensed with.

BRIEF DESCRIPTION OF THE DRAWINGS

Exemplary embodiments of the present invention with different developments and refinements are illustrated in the drawings and will be described in more detail below.

DETAILED DESCRIPTION OF THE INVENTION

Figure 1:
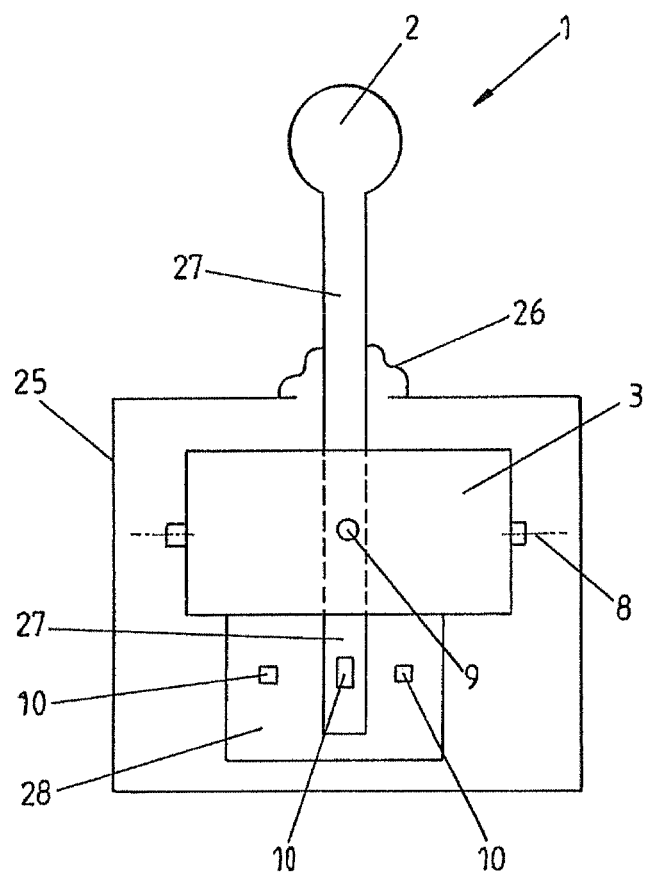
FIG. 1 shows a control element in a schematic view.

FIG. 1 shows a control element 1 which serves for the manual actuation of functions in a motor vehicle and which is used, in particular, as a gear selector switch for a shift-by-wire gearshift device. The control element 1 is equipped with a movable handle 2 in the form of a selector lever, wherein the handle 2 projects out of a housing 25 of the control element 1 in a manner sealed by way of a movable sleeve 26. The handle 2 is mounted movably on a carrier 3 which is situated in the housing 25, in such a way that the handle 2 is adjustable in at least one direction, preferably in two different directions 4, 5 (see FIG. 2) from a neutral position into at least in each case one adjustment position associated with the respective direction 4, 5. In this way, the handle 2 can be adjusted manually by the user into the adjustment positions, whereby the respectively desired functions in the motor vehicle are triggered, for example, by way of correspondingly generated signals.

Figure 2:
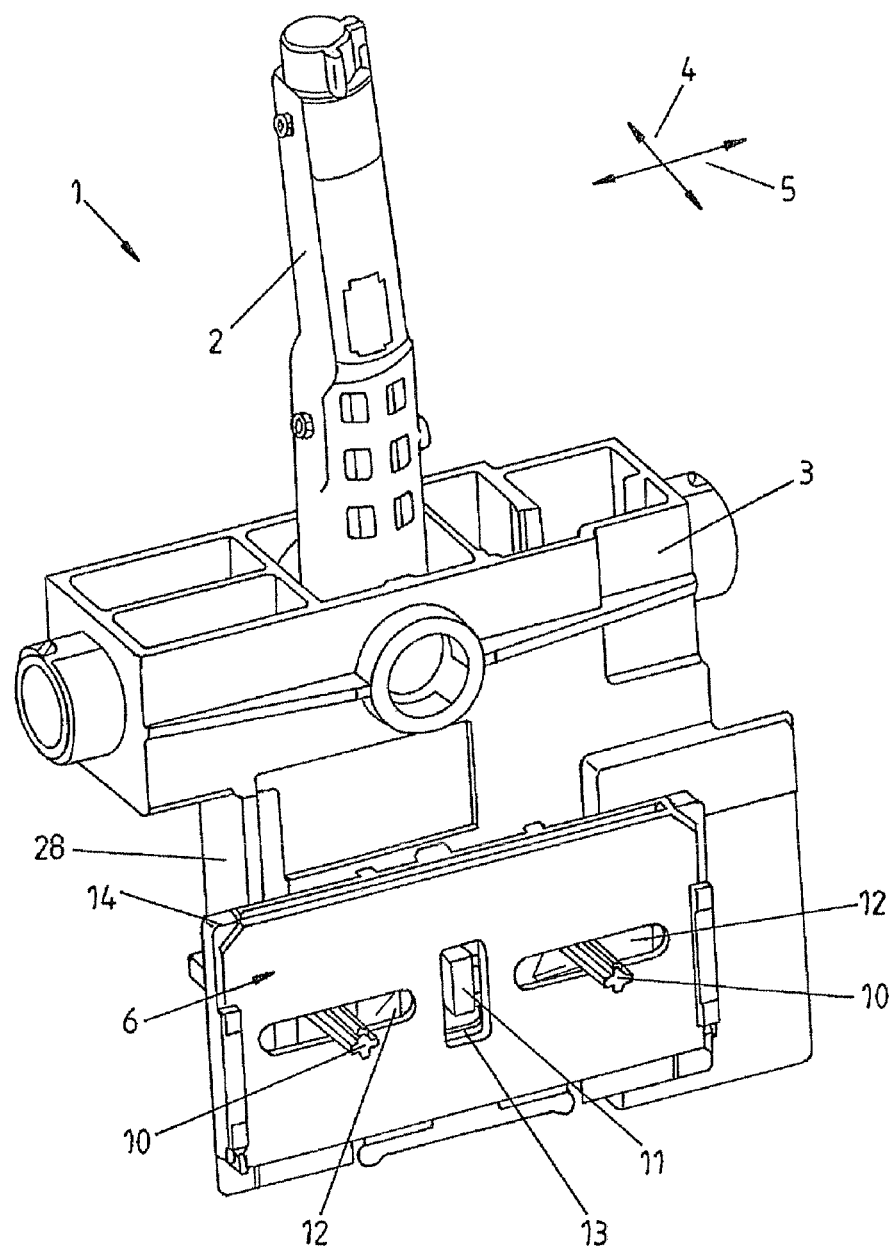
FIG. 2 shows a part of the control element from FIG. 1 in a perspective view.

The control element 1 furthermore has a means for the detection of the adjustment positions. As can be seen in FIG. 2, the means for the detection of the adjustment positions comprises a code carrier 6 which encodes the adjustment positions, wherein the code carrier 6 has a unique coding for the adjustment positions. Furthermore, the means for the detection of the adjustment positions comprises a sensor 7 which senses the coding and which is shown schematically in FIG. 4. In this way, all adjustment positions of the handle 2 can be detected by way of the one single code carrier 6.

Figure 3:
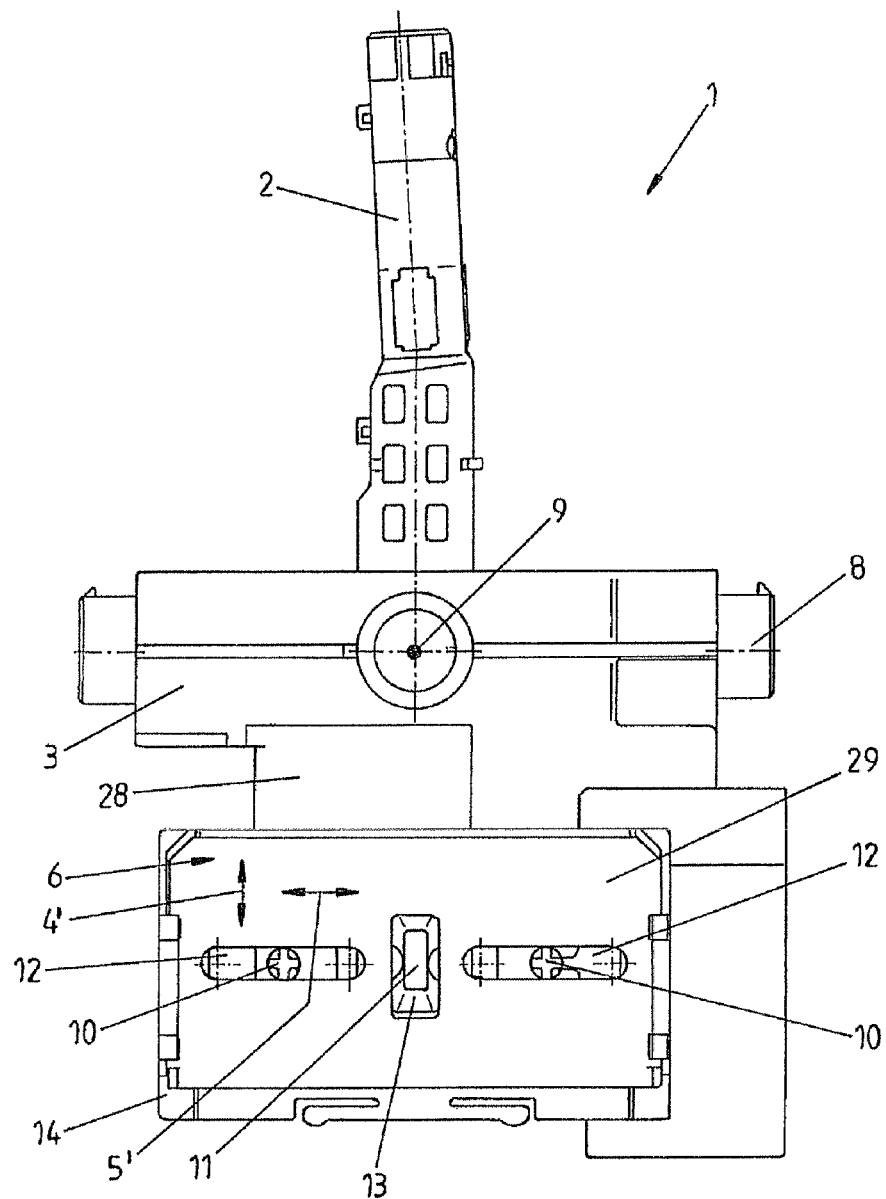
FIG. 3 shows the side view of the part of the control element from FIG. 2.

In the present case, the handle 2 is designed to be pivotably movable, such that the handle 2 is a pivotable selector lever. For this purpose, the handle 2 is, as can be seen in FIG. 3, adjustable about a first pivot axis 8 in the first pivoting direction 4 and about a second pivot axis 9 in the second pivoting direction 5, wherein the two pivoting directions 4, 5 are approximately perpendicular to one another. Specifically, the lever arm 27 of the handle 2 is mounted in the carrier 3 so as to be rotatable about the pivot axis 9, as can be seen from FIG. 1. The carrier 3 is itself mounted in the housing 25 so as to be rotatable about the pivot axis 8. Furthermore, the carrier 3 for the handle 2 is in the form of a Cardan joint or a universal joint in order to permit the two pivoting directions 4, 5 for the handle 2.

Figure 4:
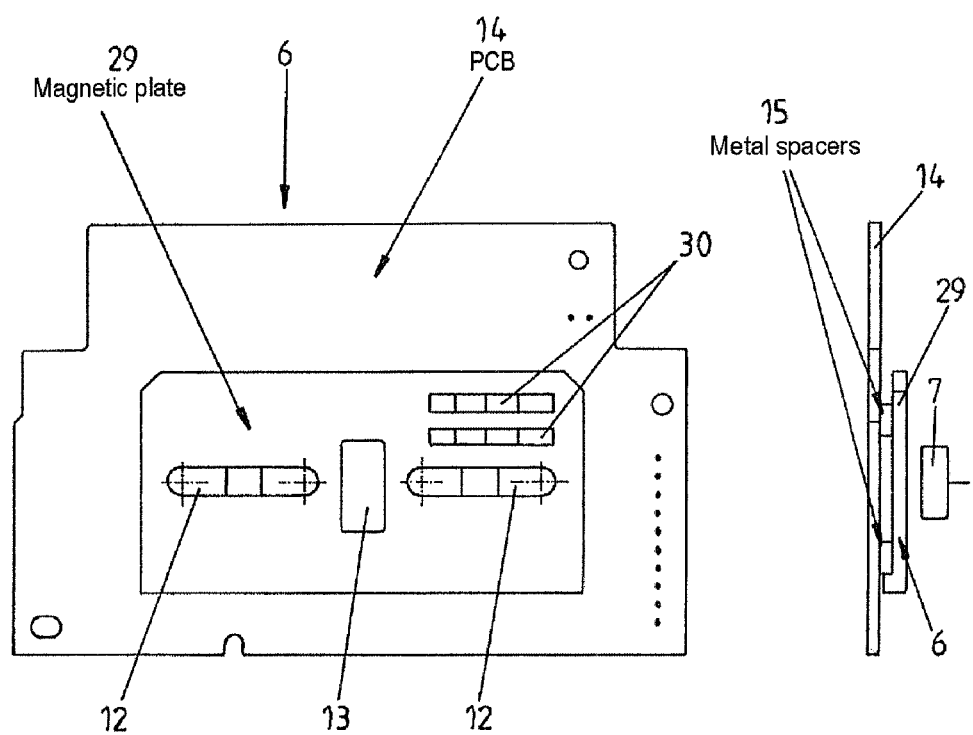
FIG. 4 shows a detail view of the code carrier from FIG. 3.

As can be seen on the basis of FIG. 2 and FIG. 4, the code carrier 6 and the sensor 7 are arranged so as to be movable relative to one another during adjustment of the handle 2. In the present case, the code carrier 6 is movable by way of the handle 2 correspondingly to the adjustment of the handle 2. Specifically, the code carrier 6 interacts with the handle 2 such that the code carrier 6 is, owing to the pivoting movement of the handle 2, linearly movable in two mutually perpendicular directions 4', 5' (see FIG. 3). The interaction of the handle 2 with the code carrier 6 is realized by way of a pin 10, 11 which engages into an elongated hole 12, 13. For this purpose, one pin 11 for the pivoting direction 5 or the linear direction 5' is arranged on the handle 2, specifically, as in FIG. 1, on the lever arm 27 of the handle 2. The pin 11 engages in turn into the corresponding elongated hole 13, which runs in one direction 4', of the code carrier 6, as can be seen from FIG. 3. At least one pin 10 for the pivoting direction 4 or for the linear direction 4' is arranged, as per FIG. 1, on the carrier 3, more precisely on an elongation 28 on the carrier 3. The pin 10 engages in turn into the corresponding elongated hole 12, which runs in the further direction 5', of the code carrier 6, as can be seen from FIG. 3. For exact guidance in the linear direction 4', 5', two pins 10 are provided on the elongation 28 and two elongated holes 12 are provided on the code carrier 6.

If desired, it is possible, instead of the linearly movable code carrier 6, for the sensor 7 to also be designed to be movable by way of the handle 2 correspondingly to the adjustment of the handle 2, though this is not illustrated in any more detail.

The code carrier 6 comprises a magnetic code plate 29 on which the adjustment positions are encoded for example by way of corresponding magnetic tracks 30, as can be seen from FIG. 4. Consequently, the coding for the adjustment positions is composed of a magnetization, uniquely associated with the respective adjustment position, of the code plate 29. The sensor 7 is composed of a magnetic sensor, for example, a Hall sensor. Use may self-evidently also be made of a magnetoresistive sensor, an inductive sensor or the like.

The code carrier 6 comprises a printed circuit board 14, wherein the magnetic code plate 29 is arranged on the printed circuit board 14, as can be seen in FIG. 4. For this purpose, the code plate 29 is fastened to the printed circuit board 14 by way of spacer pieces 15 in the form of separators. The spacer pieces 15 are in the form of metal spacers, in such a way that the magnetic code plate 29 is fastened to the printed circuit board 14 by way of the metal spacers 15 by magnetic force. The spacer pieces 15, which are for example composed of plastic, are coated with metal, such that the metal spacers 15 can be applied to the printed circuit board 14 by way of soldering. For the soldering, the SMD (Surface Mounted Device) process is expedient.

Figure 5:
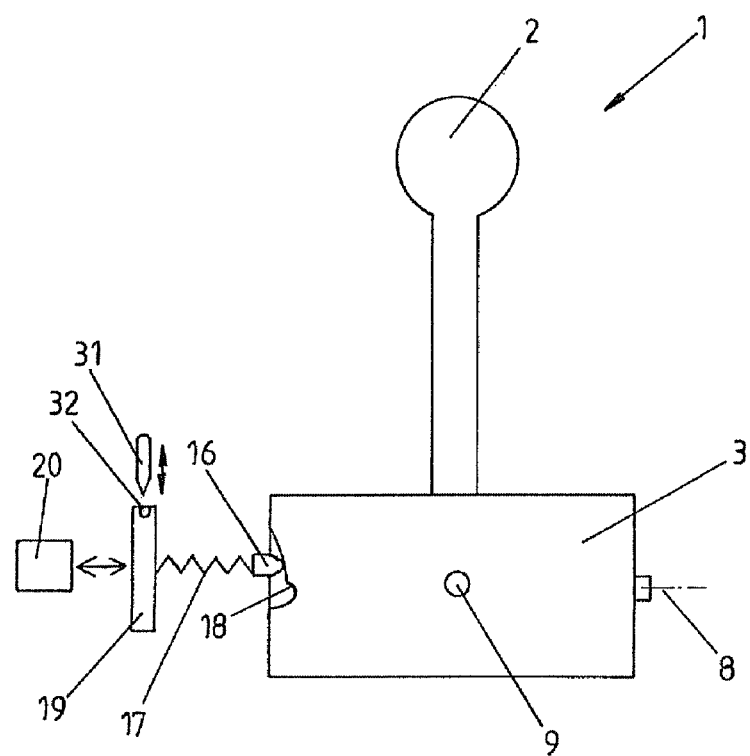
FIG. 5 shows a control element as per a further refinement in a schematic illustration.

In a further exemplary embodiment which is schematically illustrated in FIG. 5, the adjustment position in the case of the control element 1 is in the form of a detent position, in such a way that a detent force acts on the handle 2' in the adjustment position. It is likewise possible for the adjustment movement to be in the form of a detent movement, that is to say the adjustment of the handle 2 is positively guided in a defined movement gate, in such a way that a detent force acts on the handle 2 during the adjustment movement. For this purpose, the detent force may be generated by way of a spring-loaded thrust piece 16. The thrust piece 16, which is equipped with a compression spring 17, can be placed in interaction with a slotted guide 18 on the carrier 3. In particular, the interaction also serves for the generation of a haptic action, which is perceptible to the user, for the adjustment of the handle 2. For interaction, the thrust piece 16 is pushed into the slotted guide 18 for interaction purposes by way of a movable adapter 19.

The handle 2 may be designed such that it can be blocked with regard to the adjustment and can be released for the adjustment by the user. The blocking and/or release of the handle 2 is realized by way of a corresponding geometry 32 integrally formed on the adapter 19. For this purpose, an actuable blocking means 31 is capable of being operatively connected to the geometry 32. Furthermore, the adapter 19 can be moved, for the purposes of acting on the thrust piece 16, by way of an actuator 20. The actuator 20 may be an electromagnet, an electric motor or the like.

Figure 6:
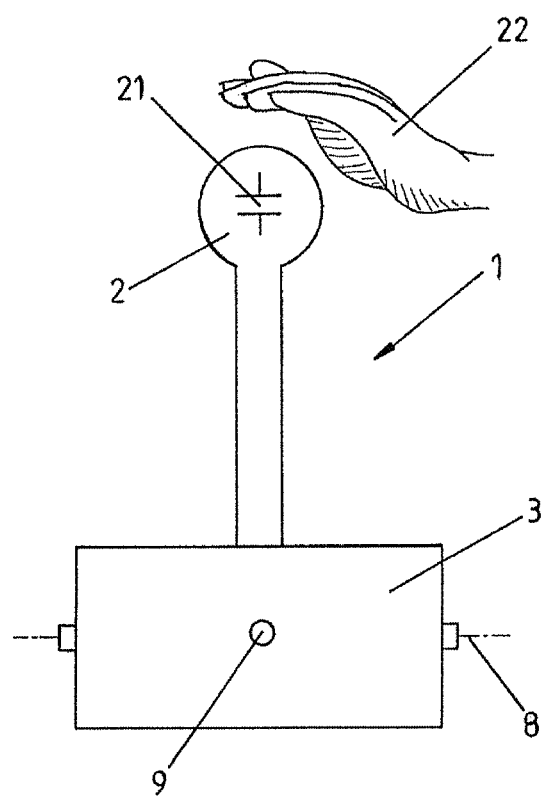
FIG. 6 shows a control element as per a yet further refinement in a schematic illustration.

In a yet further exemplary embodiment, which is schematically illustrated in FIG. 6, the handle 2 that is manually adjustable by the user is designed such that it can be blocked with regard to operation and released for operation by the user. Here, a sensor 21 for interaction with the handle 2 is provided, in such a way that, as a result of the handle 2 being approached by the hand 22 of the user and/or as a result of the handle 2 being touched, in particular gripped, by the hand 22 of the user, the operating demand of the user can be identified by the control element 1. It is self-evidently possible for some other body part of the user, for example, a finger of the user, rather than the hand 22 to be used for the detection of the operating demand. The handle 2 of the control element 1, the adjustability of which has been blocked up until that point, can thereupon be released for operation by the user. If desired, the detection of the operating demand of the user by the sensor 21 may also serve for the triggering of some other functionality in the motor vehicle.

The sensor 21 may be a capacitive sensor. The capacitive sensor 21 is arranged in the handle 2, specifically in the upper region thereof, which, for operation, is gripped by the hand 22 of the user. For this purpose, the capacitive sensor 21 generates an electric field in the surroundings of the handle 2. When the hand 22 approaches the handle 2, the electric field is changed by the hand 22. The change in the electric field is in turn detected as a change in capacitance by the sensor 21, and is evaluated for the identification of the operating demand by the user.

A proximity sensor that is based on some other operating principle may self-evidently also be used for the handle 2. For example, the sensor may be an optical sensor which operates by way of optical radiation. A sensor of the type emits optical radiation and detects that part of the optical radiation which is reflected by the hand 22, in order to identify the approach of the hand 22 toward the handle 2 and consequently the operating demand of the user. Infrared (IR) radiation, which is, in particular, not visible to the human eye, is suitable as optical radiation. Furthermore, as a sensor, use may also be made of an inductive sensor which detects the change in an electromagnetic field in the surroundings of the handle 2 caused by the hand 22 of the user.

As has already been discussed on the basis of FIG. 5, a blocking means 31 for the handle 2 may be provided, in such a way that the adjustment of the handle 2 can be blocked and released by the blocking means 31. In the event of the operating demand of the user being identified, the sensor 21 generates a sensor signal. The sensor signal then serves for the corresponding actuation of the blocking means 31 for the release of the handle 2.

A control element 1 of this type can be used for a gear selector switch in motor vehicles. In the case of such a shift-by-wire gearshift device for the transmission in the motor vehicle, the handle 2 is the selector lever for the shift-by-wire gearshift device, and the shift-by-wire gearshift device generates signals corresponding to the position of the handle 2, wherein the signals serve for the control of the transmission. The present invention is, however, not restricted to the exemplary embodiments described and illustrated, the elements of which may also be used in any desired combination with one another for the control element 1. The present invention rather encompasses all refinements that emerge to a person skilled in the art in the scope of the invention defined by the patent claims. Aside from uses in a motor vehicle, a control element 1 of this type may advantageously also be used as an input means for computers, machine tools, household appliances or the like.

LIST OF REFERENCE DESIGNATIONS

1 Control element
2 Handle
3 Carrier
4', 5' Direction/pivoting direction
4', 5' Direction/linear direction
6 Code carrier
7 Sensor
8 (First) pivot axis
9 (Second) pivot axis
10, 11 Pin
12, 13 Elongated hole
14 Printed circuit board
15 Spacer piece/metal spacer
16 (Spring-loaded) thrust piece
17 Compression spring
18 Slotted guide
19 Adapter
20 Actuator
21 (Capacitive) sensor
22 Hand
25 Housing
26 Sleeve
27 Lever arm (at the handle)
28 Elongation (on the carrier)
29 Code plate
30 Magnetic track
31 Locking means (for adapter)
32 Geometry (on the adapter)

The invention claimed is:

1. A control element, which is a switching device, for manual actuation of functions in a motor vehicle, having a handle, wherein the handle is mounted on a carrier such that the handle is adjustable in two different directions from a neutral position into at least in each case one adjustment position associated with the respective direction via a pivoting movement of the handle, and having a means for the detection of the adjustment positions, wherein the means for the detection of the adjustment positions has a code carrier which has a coding for the adjustment positions, and comprises a sensor which senses the coding, that all adjustment positions are detected by way of the one code carrier, wherein the code carrier interacts with the handle in such a way that the code carrier is linearly movable in two directions due to the pivoting movement of the handle, wherein the interaction of the handle with the code carrier is effected by way of a first pin, which is arranged on the handle, that engages a first slot of the code carrier with the first slot extending in one direction of the two directions in which the code carrier is linearly movable, and at least a second pin, which is arranged on the carrier, that engages at least a second slot of the code carrier with the second slot extending in an other direction, which is different from the one direction, of the two directions in which the code carrier is linearly movable.

2. The control element as claimed in claim 1, wherein the handle is a pivotable selector lever, in that, the handle is adjustable about a first and a second pivot axis in a first and a second pivoting direction, in that, the two pivoting directions are approximately perpendicular to one another, and in that, the carrier for the handle is formed in the manner of a Cardan joint and/or a universal joint.

3. The control element as claimed in claim 1, wherein, during adjustment of the handle, the code carrier and the sensor are movable relative to one another, and in that, the code carrier and/or the sensor are/is movable by way of the handle correspondingly to the adjustment of the handle.

4. The control element as claimed in claim 1, wherein the code carrier is, owing to the pivoting movement of the handle, linearly movable in two mutually perpendicular directions.

5. The control element as claimed in claim 1, wherein the first pin is arranged a lever farm of the handle, wherein the first pin engages into a first elongated hole, which runs in the one direction, of the code carrier, and in that, the at least second pin is arranged on an elongation on the carrier, wherein the at least second pin engages into a at least a second elongated hole, which runs in the other direction, of the code carrier.

6. The control element as claimed in claim 1, wherein the code carrier comprises a magnetic code plate, and the sensor is composed of one of a magnetic sensor, a Hall sensor, a magnetoresistive sensor, or an inductive sensor, wherein the coding for the adjustment positions is composed of a magnetization, associated with the respective adjustment position, of the code plate.

7. The control element as claimed in claim 1, wherein the code carrier comprises a printed circuit board, and in that a magnetic code plate is arranged on the printed circuit board.

8. The control element as claimed in claim 1, wherein a code plate is fastened to a printed circuit board by way of spacer pieces in the form of separators.

9. The control element as claimed in claim 8, wherein the spacer pieces are attached to the printed circuit board by way of soldering.

10. The control element as claimed in claim 8, wherein the spacer pieces are in the form of metal spacers in such a way that the code plate is fastened magnetically to the printed circuit board.

11. The control element as claimed in claim 8, wherein the spacer pieces are in the form of coated metal spacers.

12. The control element as claimed in claim 1, wherein the handle is mounted on the carrier such that the handle is adjustable in at least one direction from the neutral position into an adjustment position, and wherein the adjustment movement is in the form of a detent movement and/or the adjustment position is in the form of a detent position, in such a way that a detent force acts on the handle during the adjustment movement and/or in the adjustment position, wherein the detent force is generated by way of a spring-loaded thrust piece.

13. The control element as claimed in claim 12, wherein the handle is adjustable from the neutral position in the two different directions into at least in each case one adjustment position associated with the respective direction as the detent force acts on the handle, and in that the means for the detection of the adjustment positions is provided.

14. The control element as claimed in claim 12, wherein the handle is a pivotable selector lever, in that the handle is adjustable about a first and a second pivot axis in a first and a second pivoting direction, in that the two pivoting directions are approximately perpendicular to one another, and in that the carrier for the handle is formed in the manner of a Cardan joint and/or a universal joint.

15. The control element as claimed in claim 12, wherein the spring-loaded thrust piece is placed in interaction with a slotted guide for the purposes of generating a haptic action for the adjustment of the handle, and in that the spring-loaded thrust piece is pushed into the slotted guide for interaction purposes by way of a movable adapter.

16. The control element as claimed in claim 12, wherein the handle can be blocked with regard to the adjustment and can be released for the adjustment, in that the blocking and/or the release of the handle are/is realized by way of a geometry integrally formed on an adapter, and in that an actuable blocking member is capable of being operatively connected to the geometry.

17. The control element as claimed in claim 12, wherein an adapter can be moved, for the purposes of acting on the spring-loaded thrust piece, by way of an actuator.

18. The control element as claimed in claim 17, wherein the actuator is one of an electric motor and an electromagnet.

19. The control element as claimed in claim 1, wherein the handle is mounted on the carrier such that the handle is manually adjustable by a user, wherein the handle can be blocked with regard to operation and released for operation by the user, wherein a sensor for interaction with the handle is provided, in such a way that, as a result of the handle being at least one of approached, touched, and gripped, by the user, the operating demand of the user can be identified and the handle can be released for operation and/or some other functionality in the motor vehicle can be triggered.

20. The control element as claimed in claim 19, wherein the handle is adjustable from the neutral position in the two different directions into at least in each case one adjustment position associated with the respective direction manually by the user, and in that the means for the detection of the adjustment positions is provided.

21. The control element as claimed in claim 19, wherein the handle is a pivotable selector lever, in that the handle is adjustable about a first and a second pivot axis in a first and a second pivoting direction, in that the two pivoting directions are approximately perpendicular to one another, and in that the carrier for the handle is formed in the manner of a Cardan joint and/or a universal joint.

22. The control element as claimed in claim 19, wherein the sensor for interaction with the handle is a capacitive sensor.

23. The control element as claimed in claim 19, wherein the sensor is an optical sensor which operates by one of optical radiation, infrared radiation and an inductive sensor.

24. The control element as claimed in claim 19, wherein a blocking member for the handle is provided, in such a way that the adjustment of the handle can be blocked and/or released by the blocking member, in that the sensor for interaction with the handle generates a sensor signal in the event of the operating demand of the user being identified, and in that the sensor signal serves for the actuation of the blocking member for the release of the handle.

* * * * *